US012764986B2

(12) United States Patent
Su et al.

(10) Patent No.: US 12,764,986 B2
(45) Date of Patent: Oct. 13, 2026

(54) SEMICONDUCTOR STRUCTURE AND FORMATION METHOD THEREOF

(71) Applicant: Semiconductor Manufacturing International (Shanghai) Corporation, Shanghai (CN)

(72) Inventors: Bo Su, Shanghai (CN); Hailong Yu, Shanghai (CN); Jing Zhang, Shanghai (CN); Hansu Oh, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 411 days.

(21) Appl. No.: 18/234,210

(22) Filed: Aug. 15, 2023

(65) Prior Publication Data

US 2024/0063298 A1 Feb. 22, 2024

(30) Foreign Application Priority Data

Aug. 17, 2022 (CN) ......................... 202210987926.9

(51) Int. Cl.

*H10D 30/43* (2025.01)
*H10D 30/01* (2025.01)
*H10D 30/67* (2025.01)
*H10D 62/10* (2025.01)
*H10D 64/01* (2025.01)

(52) U.S. Cl.

CPC ........... *H10D 30/43* (2025.01); *H10D 30/014* (2025.01); *H10D 30/6735* (2025.01); *H10D 62/121* (2025.01); *H10D 64/017* (2025.01); *H10D 64/018* (2025.01)

(58) Field of Classification Search

CPC .. H10D 30/43; H10D 30/014; H10D 30/6735; H10D 62/121; H10D 64/018; H10D 64/017

USPC .......................................................... 257/347

See application file for complete search history.

(56) References Cited

U.S. PATENT DOCUMENTS

2021/0399099 A1* 12/2021 Chu .................. H10D 30/6729

* cited by examiner

*Primary Examiner* — Tu-Tu V Ho

(74) *Attorney, Agent, or Firm* — Anova Law Group, PLLC

(57) ABSTRACT

A semiconductor structure includes a plurality of composite layers formed on a portion of a substrate. An interlayer dielectric layer is formed on the substrate and the plurality of composite layers. A first gate trench is formed on the interlayer dielectric layer, and a gate sidewall is formed on a side surface of the first gate trench. The composite layer includes stacked channel layers and a second gate trench between neighboring channel layers. The first gate trench and the gate sidewall cross over a portion of a sidewall and a portion of a top surface of the composite layer, and the first gate trench communicates with the second gate trench. A gate is formed in the first and second gate trenches. The doping region is formed in a channel layer. The source-drain layer is formed in the composite layer on two sides of the gate structure.

20 Claims, 15 Drawing Sheets

SEMICONDUCTOR STRUCTURE AND FORMATION METHOD THEREOF

CROSS-REFERENCE TO RELATED APPLICATION

This application claims the priority of Chinese Patent Application No. 202210987926.9, filed on Aug. 17, 2022, the entire content of which is hereby incorporated by reference.

FIELD OF THE DISCLOSURE

The present disclosure generally relates to the field of semiconductor manufacturing technology and, more particularly, relates to a semiconductor structure and a formation method of the semiconductor structure.

BACKGROUND

Compared to a planar Metal-Oxide-Semiconductor Field-Effect Transistor (MOSFET), a Fin Field-Effect Transistor (Fanfest) has greater short-channel suppression capability and higher operating current. FinFETs are widely used in various semiconductor devices. However, with the further development of semiconductor technology, as transistor dimension shrinks to below a few nanometers, FinFET reaches a dimension limit. Fin distance, short-channel effect, leakage, or material limitation causes transistor manufacturing to become difficult. Even the physical structure of the FinFET cannot be realized.

Gate-All-Around (GAA) device becomes a new direction of research and development in the industry. With this technology, the channel is four-side wrapped by the gate. The source and the drain are no longer in contact with the substrate. Instead, the basic structure and function of MOSFET can be realized by arranging a plurality of sources and drains that are wire-like, planar, or strip-like laterally and perpendicular to the gate. Thus, the problems due to the reduced distance between the gates can be greatly solved, including capacitance effects. In addition, the gate is four-side wrapped by the gate. Thus, the channel current is smoother compared to a three-side wrapped FinFET.

BRIEF SUMMARY OF THE DISCLOSURE

The present disclosure provides a semiconductor structure and a method for forming the semiconductor structure to improve the performance of the semiconductor structure.

One aspect of the present disclosure includes a semiconductor structure, including a substrate, a plurality of composite layers, an interlayer dielectric layer, a first gate trench, a gate sidewall, a gate, a doping region, and a source-drain layer. The plurality of composite layers are formed on a portion of the substrate. A composite layer of the plurality of composite layers includes a plurality of channel layers stacked one over another and a second gate trench between two neighboring channel layers. The interlayer dielectric layer is formed on a surface of the substrate and surfaces of the plurality of composite layers. The first gate trench is formed on the interlayer dielectric layer, and the gate sidewall is formed on a side surface of the first gate trench. The first gate trench and the gate sidewall cross over a portion of a sidewall and a portion of a top surface of the composite layer, and the first gate trench communicates with the second gate trench. The gate is formed in the first gate trench and the second gate trench. The gate and the gate sidewall form a gate structure. The doping region is formed in a channel layer under the gate sidewall. The source-drain layer is formed in the composite layer on two sides of the gate structure.

Another aspect of the present disclosure includes a method for forming a semiconductor structure. The method includes providing a substrate and forming a plurality of initial composite layers on a portion of the substrate. An initial composite layer of the plurality of initial composite layers includes a plurality of initial channel layers stacked one over another and a first sacrificial layer between two neighboring initial channel layers. The method further includes forming a dummy gate across the initial composite layer, doping a dopant in the initial composite layer exposed by the dummy gate to form an initial doping region in the initial composite layer, after forming the initial doping region, forming a gate sidewall on a side surface of the dummy gate to form a dummy gate structure with the dummy gate and the gate sidewall, and forming a source-drain layer in the initial doping region on two sides of the dummy gate structure. The dummy gate is formed on a top and a sidewall surface of a portion of the initial composite layer. The initial channel layer under the dummy gate structure is used as the channel layer, and the initial doping region in the channel layer is used as the doping region.

As disclosed, the technical solutions of the present disclosure have the following advantages.

In the disclosed method for forming the semiconductor structure of the technical solution of the present disclosure, before forming the gate sidewall, the dopant can be doped in the initial composite layer exposed by the dummy gate to form the initial doping region in the initial channel layer. The doping region formed under the gate sidewall can be used to increase the doping ion concentration in the neighboring region of the channel layer and the source-drain layer. Thus, the resistance of the neighboring region can be reduced, which is beneficial to increase the operating current of the formed GAA device. Therefore, the device performance can be improved.

Further, after forming the dummy gate, and before forming the initial doping region, the dummy gate dielectric material layer exposed by the dummy gate can be etched to form the dummy dielectric layer. Thus, the bottom of the sidewall can be in contact with the surface of the channel layer. Thus, the dummy dielectric layer may not exist between the bottom of the sidewall and the surface of the channel layer. Therefore, when the dummy gate dielectric layer is removed, the over-etching of the dummy gate dielectric layer may not cause the conduction between the source-drain layer and the gate.

In the semiconductor structure of the technical solution of the present disclosure, the doping region under the gate sidewall can be used to increase the doping ion concentration of the neighboring region of the channel layer and the source-drain layer. Thus, the resistance of the neighboring region can be reduced, which is beneficial to increase the operating current of the formed GAA device. Therefore, the device performance can be improved.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

The terms "surface" and "on" used in this specification are used to describe relative spatial position relationship, which is not limited to direct contact.

FIGS. 1 to 10 are schematic structure diagrams showing a process of forming a semiconductor structure.

Figure 1:
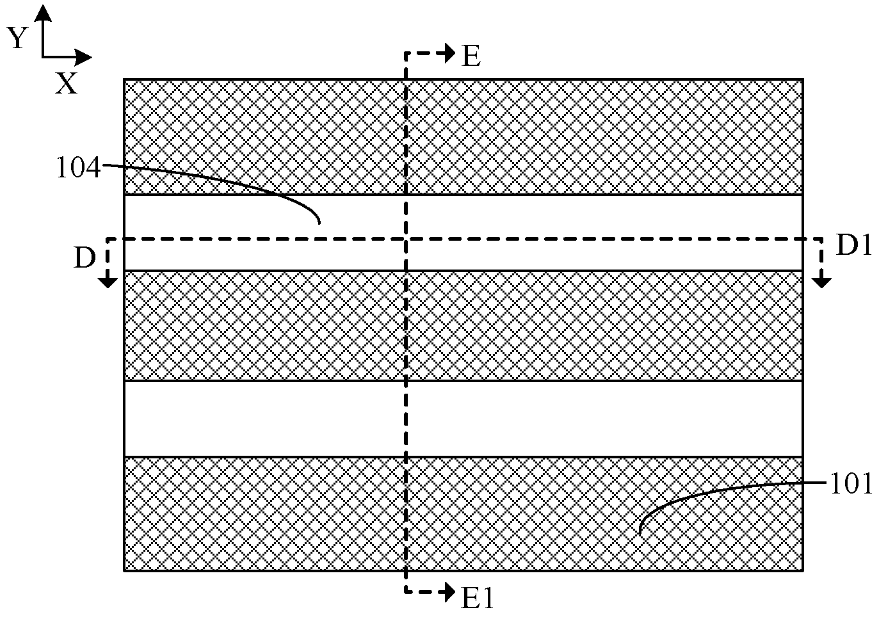
FIGS. 1-10 illustrate a schematic structural diagram of a formation process of a semiconductor structure consistent with the disclosed embodiments of the present disclosure.
Figure 2:
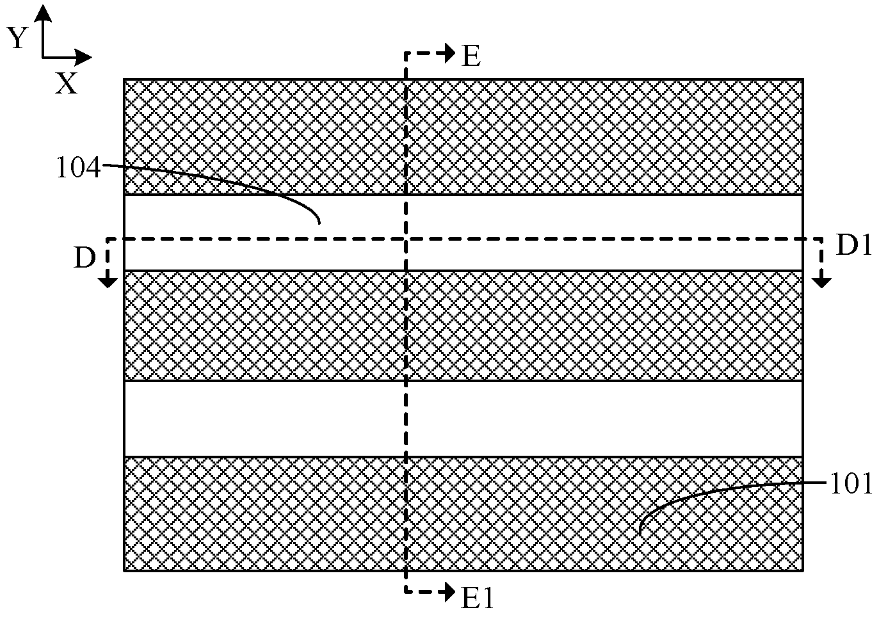
Figure 3:
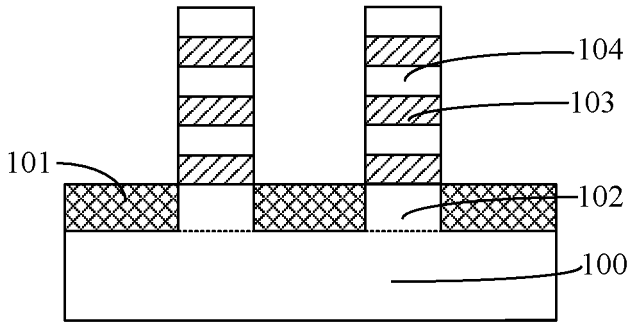

As shown in FIGS. 1 to 3, FIG. 1 is a top view of FIG. 2 and FIG. 3. FIG. 2 is a cross-sectional view along direction D1D2 of FIG. 1. FIG. 3 is a cross-sectional view along direction EE1 of FIG. 1. The method includes forming a substrate 100, a plurality of composite layers formed on substrate 100, and an isolation structure 101 formed between two neighboring composite layers of the plurality of composite layers. The plurality of composite layers are formed in parallel with first direction X and along second direction Y. One composite layer of the plurality of composite layers includes a bottom region 102, a plurality of sacrificial layers 103 stacked one over another, and a channel layer 104 formed between two neighboring sacrificial layers 103 of the plurality of sacrificial layers 103. The isolation structure is formed at a sidewall of the bottom region 102.

Figure 4:
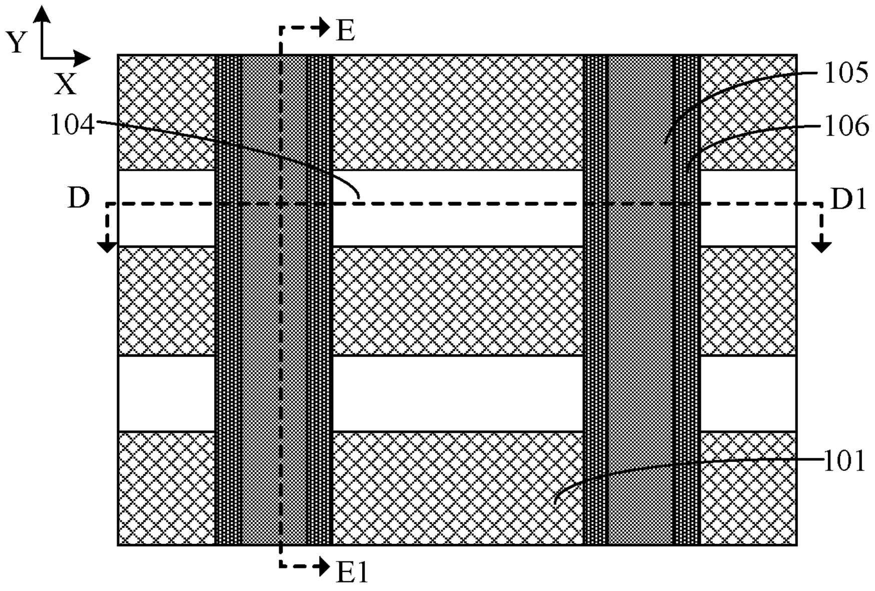
Figure 5:
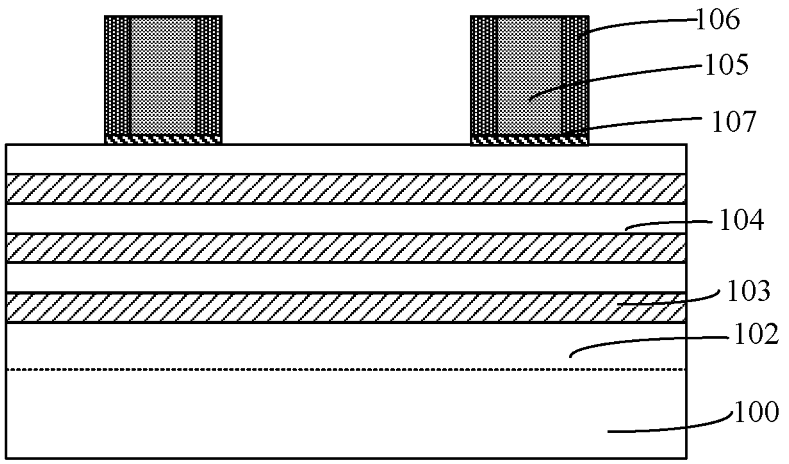
Figure 6:
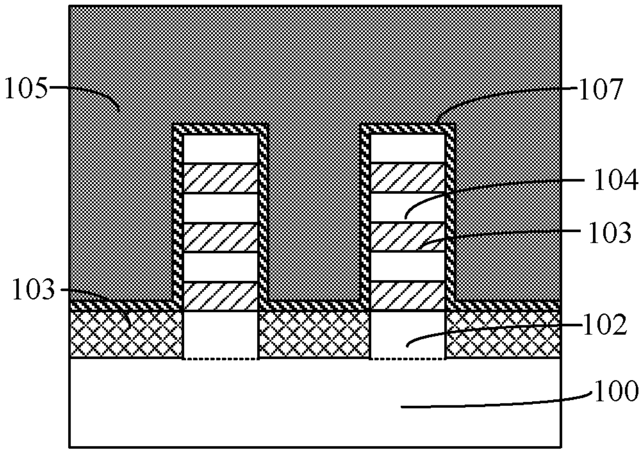

As shown in FIGS. 4 to 6, FIG. 4 is a top view of FIG. 5 and FIG. 6, FIG. 5 is a cross-sectional view along direction D1D2 in FIG. 4, and FIG. 6 is a cross-sectional view along direction EE1 in FIG. 4. A dummy gate structure is formed across the composite layer. The dummy gate structure includes a dummy gate 105, a sidewall 106 formed at the sidewall of the dummy gate 105, and a dummy gate oxide layer 107 at the bottom of the dummy gate 105 and the sidewall 106.

Figure 7:
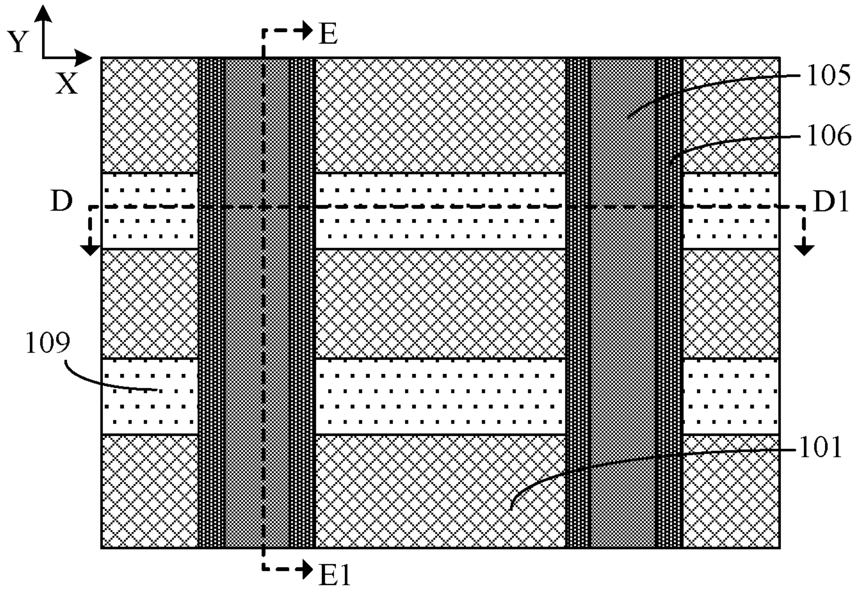
Figure 8:
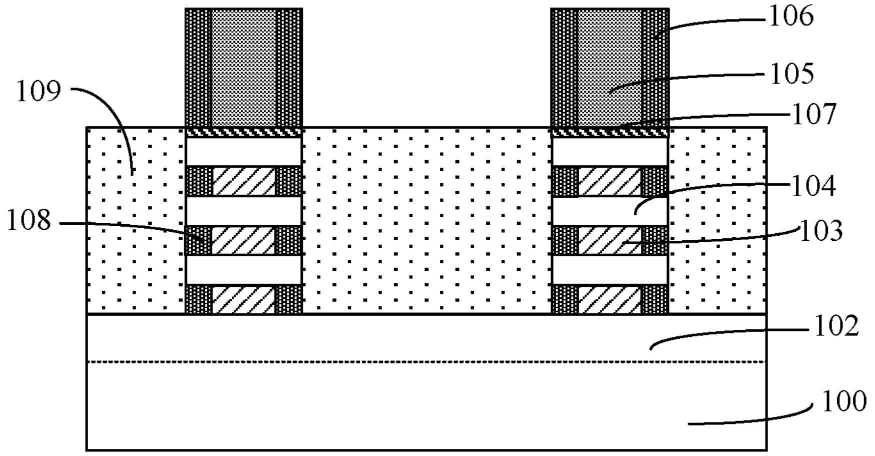

As shown in FIG. 7 and FIG. 8, FIG. 7 is a top view of FIG. 8, and FIG. 8 is a cross-sectional view along direction D1D2 in FIG. 7. Grooves (not shown in the figure) can be formed in the composite layers on two sides of the dummy gate structure. The sacrificial layer 103 exposed by the groove can be etched to form a first opening (not shown in the figure) between two neighboring channel layers 104. A sidewall 108 is formed in the first opening. After forming the sidewall 108, a source-drain layer 109 is formed in the groove.

Figure 9:
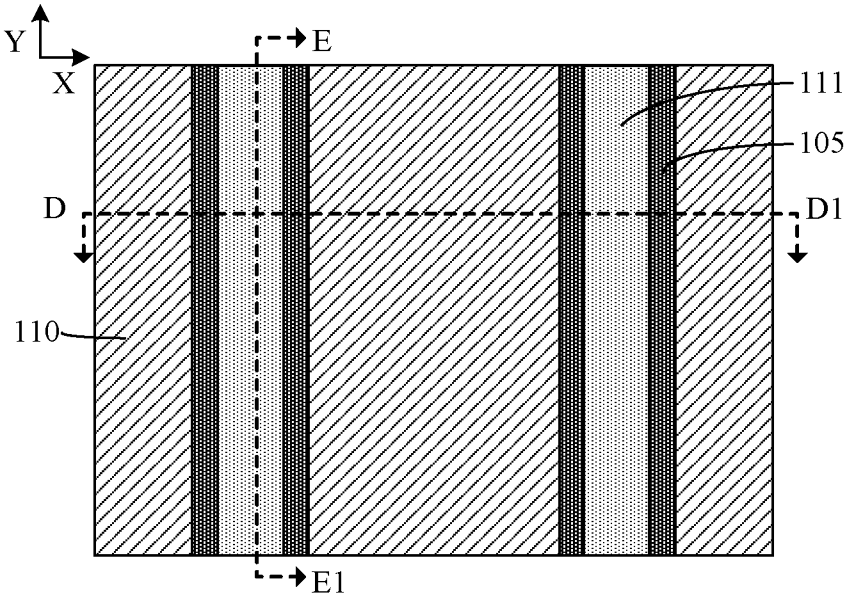
Figure 10:
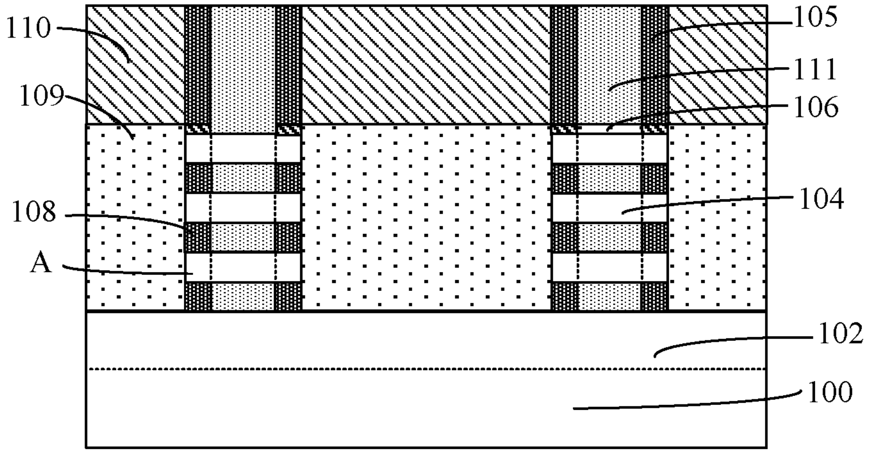

As shown in FIG. 9 and FIG. 10, FIG. 9 is a top view of FIG. 10, and FIG. 10 is a cross-sectional view along direction D1D2 of FIG. 9. An interlayer dielectric layer 110 is formed on a surface of the isolation structure 101 and a surface of the source-drain layer 109. The interlayer dielectric layer 110 exposes a surface of the dummy gate 105. The dummy gate 105 and the dummy gate oxide layer 107 are removed to form a gate trench (not shown in the figure) in the interlayer dielectric layer 110. The sacrificial layer 103 exposed by the gate trench is removed to form a second opening (not shown in the figure) between two neighboring channel layers 104. A gate dielectric layer (not shown in the figure) can be formed in the second opening and the gate trench. A gate 111 is formed on the gate dielectric layer.

In a GAA device formed in the above method, the channel layer 104 below the sidewall 105 includes an end region A. Since a diffusion length of dopants in the source-drain layer 109 is short, the end region A can have a large resistance due to a low doping ion concentration. Thus, an operating current of the formed GAA device can be low, thereby affecting the device performance.

To solve the above problems, an improvement method includes increasing an activation temperature of dopant ions in the source-drain layer 109. That is, an annealing temperature during a process of forming the source-drain layer 109 can be increased. However, with a high annealing temperature, germanium ions of the sacrificial layer 103 can diffuse into the channel layer 104, which causes the size of the channel layer 104 to decrease and affects the device performance negatively.

To address the above problem, the present disclosure provides a method for forming a semiconductor structure. The method includes doping dopant into an initial composite layer exposed by the dummy gate before forming the gate sidewall and forming an initial doping region in an initial channel layer. The doping region below the gate sidewall can be used to increase a doping ion concentration of the channel layer and a neighboring region to the source-drain layer. Thus, the resistance of the neighboring region can be reduced, which is beneficial to increase the operating current of the GAA device to improve the device performance.

To make the above objectives, features, and advantageous effects of the present disclosure obvious, embodiments of the present disclosure are described in detail below in connection with the accompanying drawings.

FIGS. 11 to 29 illustrate schematic structural diagrams showing processes of a formation process of a semiconductor structure consistent with the disclosed embodiments of the present disclosure. FIG. 30 illustrates a schematic flowchart of a method for forming the semiconductor structure consistent with the disclosed embodiments of the present disclosure.

Figure 11:
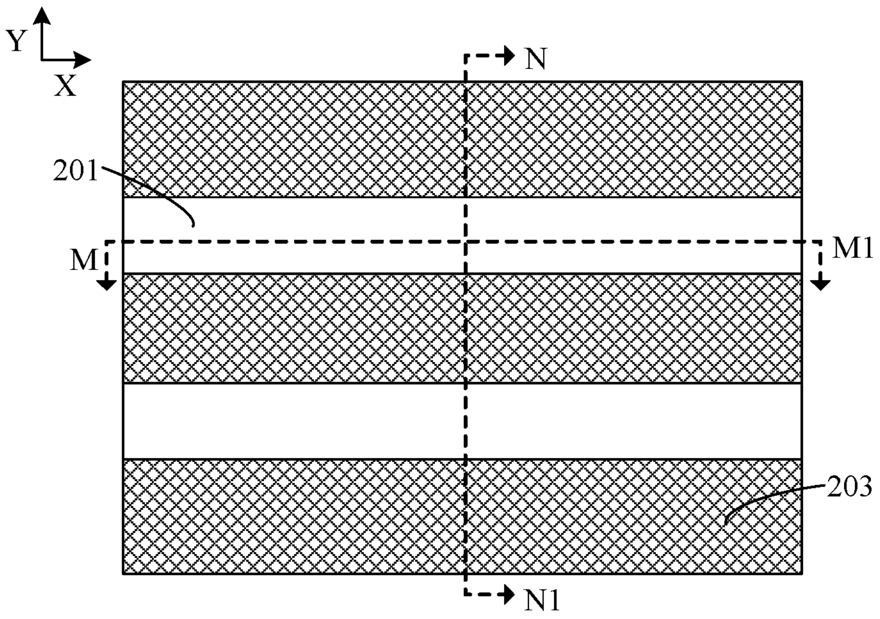
FIGS. 11 to 29 illustrate schematic structural diagrams showing processes of a formation process of a semiconductor structure consistent with the disclosed embodiments of the present disclosure.
Figure 12:
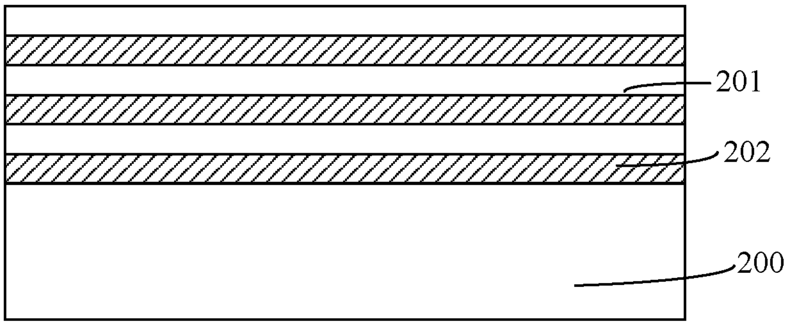
Figure 13:
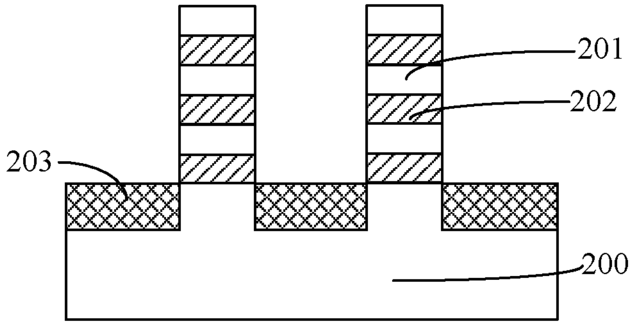

As shown in FIG. 30, a substrate is provided (S101), and a plurality of initial composite layers are formed on a portion of the substrate, an initial composite layer of the plurality of initial composite layers includes a plurality of initial channel layers stacked one over another and a first sacrificial layer between two neighboring initial channel layers (S102). As shown in FIGS. 11 to 13, FIG. 11 is a top view of FIG. 12 and FIG. 13, FIG. 12 is a cross-sectional view along direction MM1 in FIG. 11, and FIG. 13 is a cross-sectional view along direction NN1 of FIG. 11. A substrate 200 is provided. A plurality of initial composite layers are formed on a portion of the substrate 200. An initial composite layer of the plurality of initial composite layers includes a plurality of initial channel layers 201 stacked one over another and a first sacrificial layer 202 between two neighboring initial channel layers 201.

In some embodiments, the plurality of initial composite layers are formed parallel to first direction X and along second direction Y.

In some embodiments, a material of the substrate 200 can include silicon. In some other embodiments, the material of the substrate can include silicon carbide, silicon germanium, multicomponent semiconductor material composed of III-V group elements, silicon on insulator (SOI), or germanium on insulator (GOI). The multicomponent semiconductor material composed of III-V group elements can include InP, GaAs, GaP, InAs, InSb, InGaAs, and/or InGaAsP.

In some embodiments, the method for forming the plurality of initial composite layers can include forming a composite material layer (not shown in the figure) on the surface of the substrate 200. The composite material layer includes a plurality of channel material layers (not shown in the figure) vertically stacked one over another and a first sacrificial material layer (not shown in the figure) between two neighboring channel material layers. The method can further include forming a first mask layer (not shown in the figure) on a surface of the composite material layer, the first mask layer exposing a portion of the composite material layer, etching the composite material layer fusing the first mask layer as a mask until the surface of the substrate 200 is exposed, forming a plurality of composite layers using the composite material layer, forming the first sacrificial layer 202 using the first sacrificial material layer, and forming the initial channel layer 201 using the channel material layer.

In some embodiments, after etching the composite material layer using the first mask layer as the mask, the substrate 200 can be further etched to form an isolation groove (not shown in the figure) in the substrate 200, an isolation structure 203 can be formed within the isolation groove, and the first mask layer is removed.

The channel material layer can be used to form the initial channel layer 201 to form the channel layer. The first sacrificial material layer can be used to subsequently form the first sacrificial layer 202. The first sacrificial layer 202 can occupy the space for forming the gate structure subsequently. The material of the first sacrificial material layer can have a high etching selectivity relative to the material of the channel material layer. Thus, when the first sacrificial layer 202 is removed subsequently, the impact on the channel layer can be small. The material of the first sacrificial material layer can have good lattice matching compared to the material of the channel material layer. Thus, a smooth interface between the sacrificial layer and the channel layer can be obtained. The surface of the channel layer that is subsequently formed can be planar, which is beneficial to obtain a device with good performance.

The material of the first sacrificial material layer can include germanium-silicon (GeSi), and the material of the channel material layer can include silicon. In some embodiments, the material of the channel material layer can be silicon, and the material of the sacrificial material layer can be GeSi. In some other embodiments, the material of the channel material layer can be Ge or GeSi. In some other embodiments, the material of the sacrificial material layer can be ZnS, ZnSe, BeS, or GaP.

Figure 14:
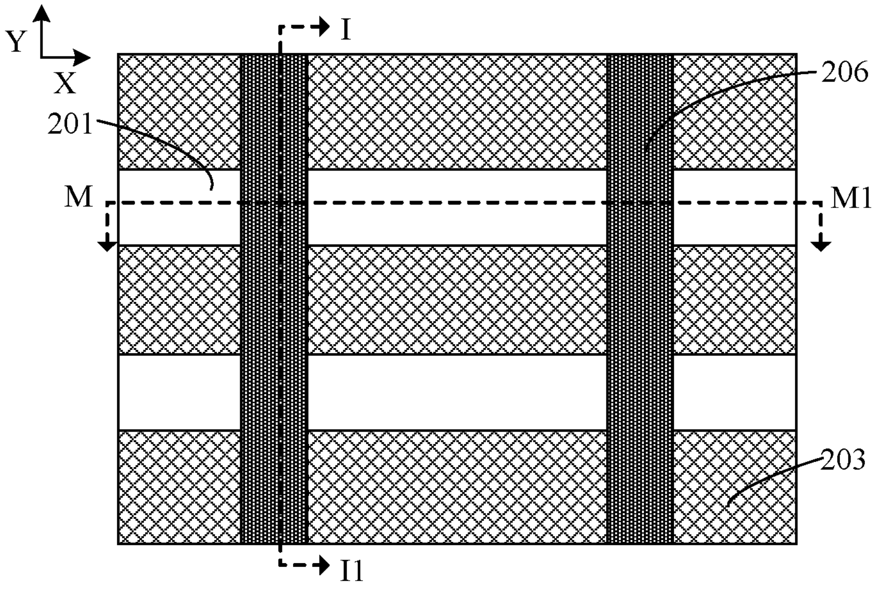
Figure 15:
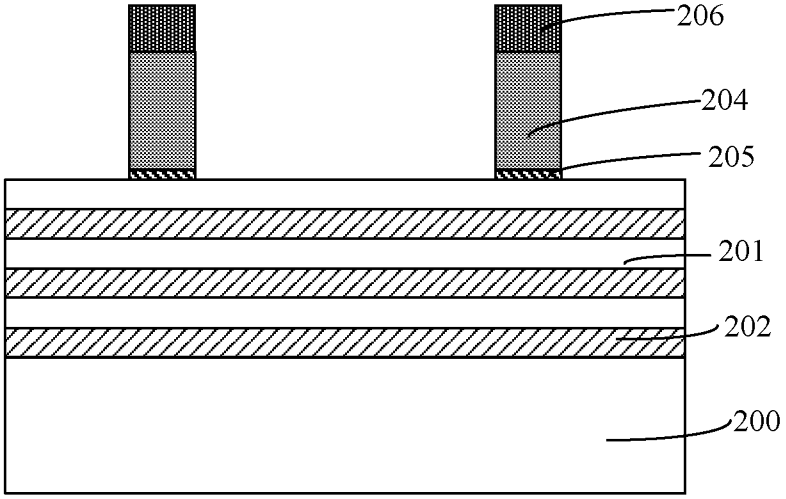
Figure 16:
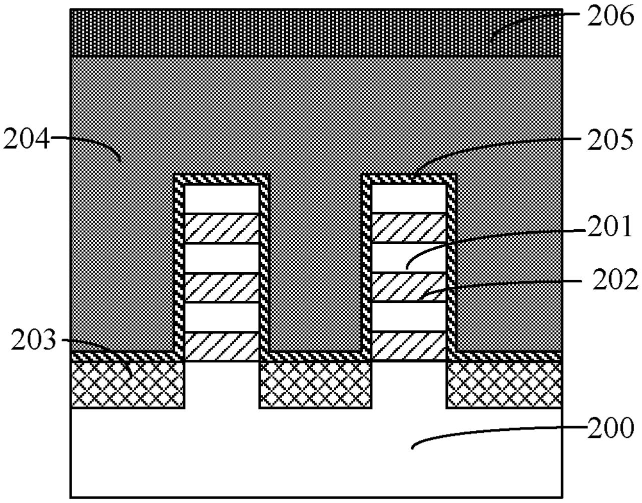

As shown in FIG. 30, a dummy gate across the initial composite layer is formed on a top surface and a sidewall surface of a portion of the initial composite layer (S103). As shown in FIGS. 14 to 16, FIG. 14 is a top view of FIG. 15 and FIG. 16, FIG. 15 is a cross-sectional view along direction MM1 of FIG. 14, and FIG. 16 is a cross-sectional view along direction II1 of FIG. 14. A dummy gate 204 across the initial composite layer is formed. The dummy gate 204 is formed on the top and sidewall surface of a portion of the initial composite layer.

In some embodiments, after forming the plurality of initial composite layers and before forming the dummy gate 204, a dummy gate dielectric material layer (not shown in the figure) is formed on the surfaces of the substrate 200 and the plurality of initial composite layers.

Subsequently, dopants can be doped into the initial composite layer exposed by the dummy gate 204 to form an initial doping region in the initial composite layer.

In some embodiments, after forming the dummy gate 204 and before forming the initial doping region, the dummy gate dielectric material layer exposed by the dummy gate 204 can be etched to form a dummy gate dielectric layer 205.

Forming the dummy gate dielectric layer 205 by etching the dummy gate dielectric material layer exposed by the dummy gate 204 can allow the bottom of the gate sidewall that is subsequently formed to be in contact with the surface of the channel layer. Thus, the dummy gate dielectric layer does not exist between the gate sidewall bottom and the surface of the channel layer. Therefore, when removing the dummy gate dielectric layer 205, the conduction between the source-drain layer and the gate can be avoided due to over-etching of the gate dielectric layer 205.

In some embodiments, the top surface of the dummy gate 204 also includes a second mask layer 206. Forming the dummy gate 204 can include forming a dummy gate material layer (not shown in the figure) on the surfaces of the substrate 200 and the plurality of initial composite layers, forming the second mask layer 206 on a portion of the dummy gate material layer, and etching the dummy gate material layer by using the second mask layer 206 as the mask until the surface of the substrate 200 is exposed.

In some embodiments, forming the dummy gate dielectric layer 205 can include forming the dummy gate dielectric material layer on the surfaces of the substrate 200 and the plurality of initial composite layers before forming the dummy gate material layer, etching the dummy gate material layer by using the second mask layer 206 as the mask until the surface of the substrate 200 is exposed, forming the dummy gate 204 using the dummy gate material layer, and forming the dummy gate substrate 200 using the dielectric material layer.

In some embodiments, before forming the initial doping region and after forming the dummy gate dielectric layer 205, a sacrificial sidewall (not shown in the figure) can be formed on the sidewall of the dummy gate 204.

In some embodiments, a thickness of the sacrificial sidewall can range from 1 nm to 10 nm. In forming the initial doping region subsequently, the sacrificial sidewall can be used to reduce the probability of dopants entering the initial channel layer 201 below the dummy gate 204, thereby reducing the impact on the subsequently formed channel layer.

Subsequently, dopants can be doped into the initial composite layer exposed by the dummy gate 204 to form the initial doping region in the initial composite layer.

Forming the initial doping region can include a solid-state source diffusion process or an ion doping process.

In some embodiments, forming the initial doping region can include the solid-state source diffusion process.

In some embodiments, for a formation method of the initial doping region, reference is made to FIGS. 17 to 20.

Figure 17:
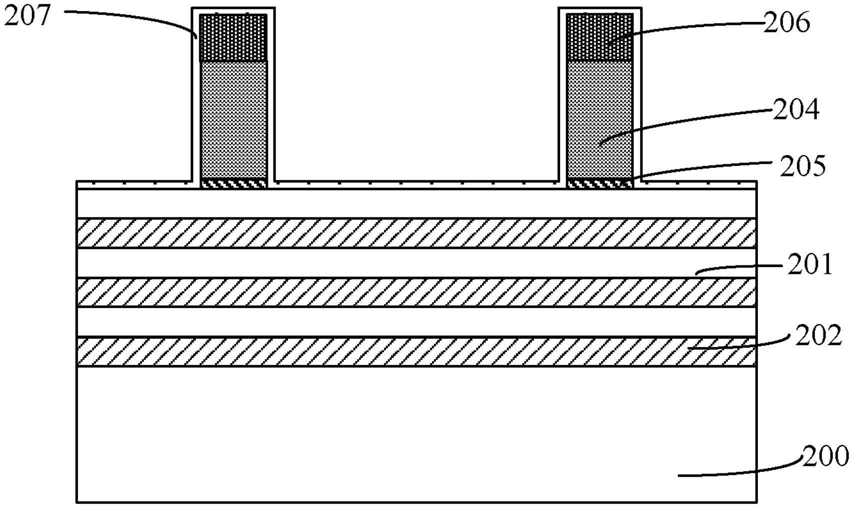
Figure 18:
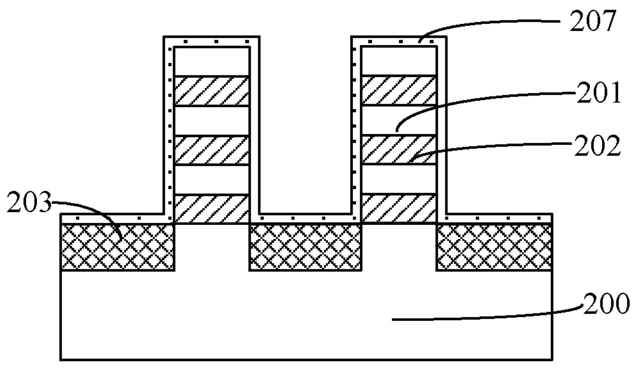

As shown in FIG. 30, a dopant is doped in the initial composite layer exposed by the dummy gate to form the initial doping region in the initial composite layer (S104). As shown in FIG. 17 and FIG. 18, FIG. 17 has a same view direction as FIG. 15, and FIG. 18 has a same view direction as FIG. 13. A second sacrificial material layer 207 is formed on the surfaces of the substrate 200 and the initial composite layer. The second sacrificial material layer 207 includes dopants.

In some embodiments, the dopants can include N-type or P-type ions.

In some embodiments, a thickness of the second sacrificial material layer 207 can range from 2 nm to 7 nm.

Figure 19:
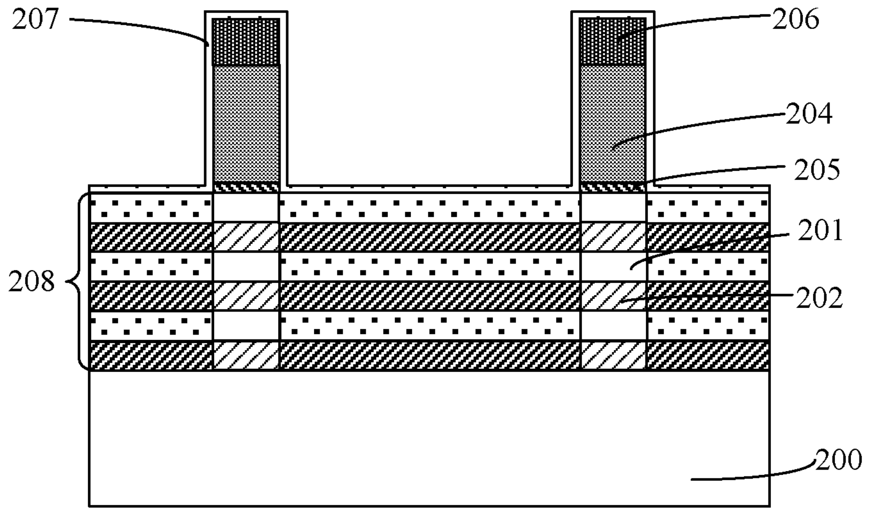
Figure 20:
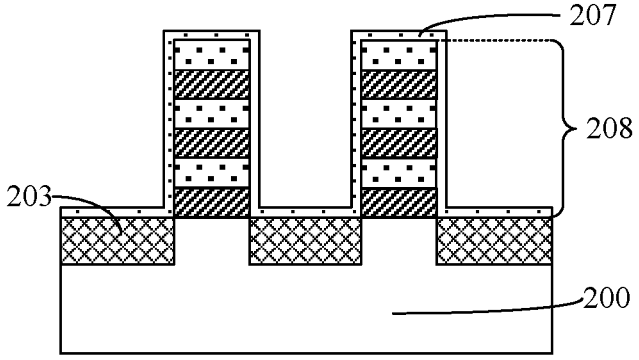

As shown in FIG. 19 and FIG. 20, FIG. 19 has a same view direction as FIG. 17, and FIG. 20 has a same view direction as FIG. 18. An annealing process can be performed on the second sacrificial material layer 207 to cause the dopant to enter the initial composite layer to form the initial doping region 208.

The dopant concentration in the initial doping region 208 can range from 1E8 atom/cm3 to 9E15 atom/cm3.

In some embodiments, a temperature range of the annealing process can be less than or equal to 650° C.

In some embodiments, after forming the initial doping region 208, the second sacrificial material layer 207 can be removed.

In some embodiments, after forming the initial doping region 208, the sacrificial sidewall can be also removed.

Figure 21:
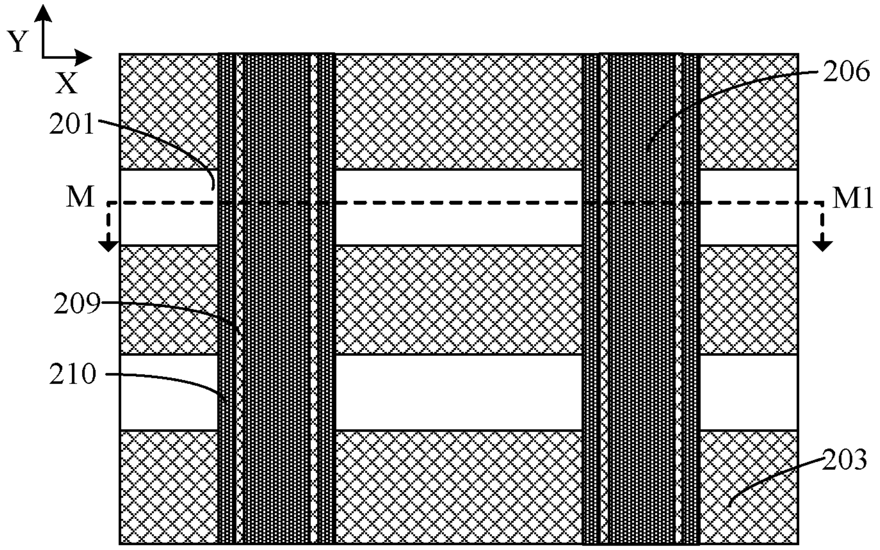
Figure 22:
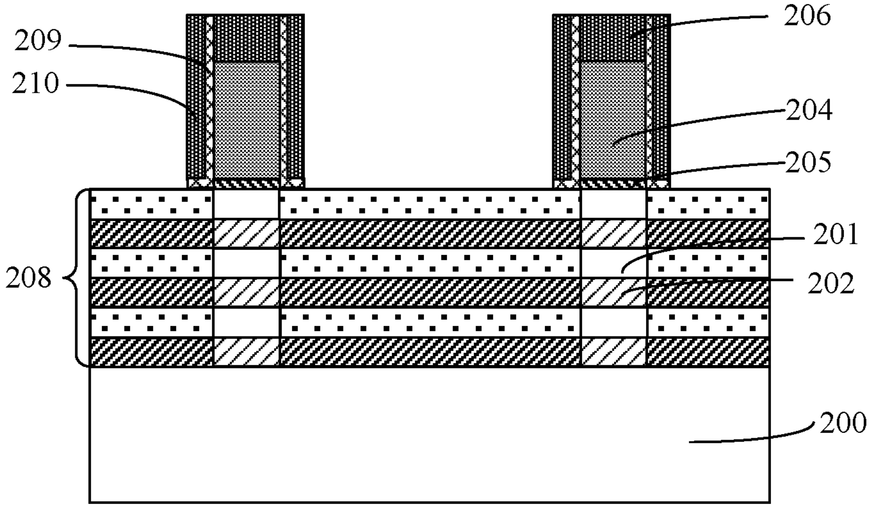

As shown in FIG. 30, after forming the initial doping region, a gate sidewall is formed on a side surface of the dummy gate, and the dummy gate and the gate sidewall form the dummy gate structure (S105). As shown in FIG. 21 and FIG. 22, FIG. 21 is a top view of FIG. 22, and FIG. 22 is a cross-sectional view along direction MM1 of FIG. 21. After forming the initial doping region 208, a gate sidewall is formed on the sidewall of the dummy gate 204. A dummy gate structure can be formed by the dummy gate 204 and the gate sidewall.

In some embodiments, the gate sidewall is also formed on the sidewall of the second mask layer 206.

A material of the gate sidewall can include a dielectric material. A material of the dielectric material layer can include one or more of silicon oxide, silicon nitride, silicon oxynitride, silicon carbide, silicon carbonitride, and/or silicon carbon oxynitride.

In some embodiments, the gate sidewall includes a first sidewall 209 and a second sidewall 210 formed on the sidewall of the first sidewall 209. In some embodiments, the gate sidewall can be a dual-layer structure. In some other embodiments, the gate sidewall can also be a single-layer structure or a multi-layer structure.

In some embodiments, forming the gate sidewall can include forming a first sidewall material layer (not shown in the figure) on the surfaces of the initial composite layer and the substrate 200 and a second sidewall material layer (not shown in the figure) on the first sidewall material layer, etching back the second sidewall material layer until the surfaces of the substrate 200 and the initial composite layer are exposed, using the first sidewall material layer as the first sidewall 209, and using the second sidewall material layer as the second sidewall 210.

In some embodiments, a material of the first sidewall 209 can include silicon oxide, and a material of the second sidewall 210 can include silicon nitride.

Subsequently, the source/drain layers can be formed in the initial doping regions 208 on two sides of the dummy gate structure. The initial channel layer 201 under the dummy gate structure can be used as the channel layer, and the initial doping region 208 in the channel layer can be used as the doping region. For the method of forming the source-drain layer, reference can be made to FIG. 23 to FIG. 26.

Figure 23:
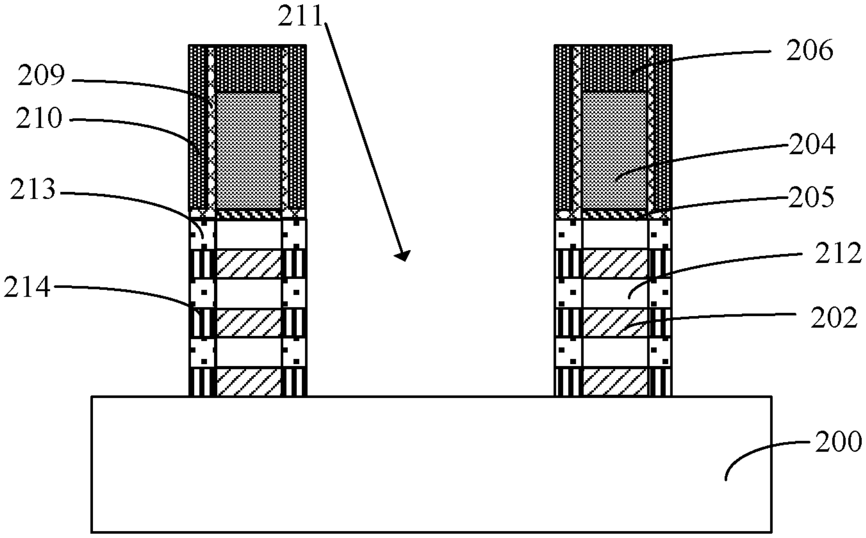

As shown in FIG. 30, the source-drain layer is formed in the initial doping region on the two sides of the dummy gate structure, the initial channel layer of the dummy gate structure is used as the channel layer, and the initial doping region of the channel layer is used as the doping region (S106). Based on FIG. 22, as shown in FIG. 23, the first openings 211 are formed in the initial composite layers 208 on the two sides of the dummy gate structure, and the initial channel layer 201 can be used as the channel layer 212.

The initial doping region 208 in the channel layer 212 can be used as the doping region 213. The doping region 213 can be formed below the gate sidewall.

In some embodiments, the first opening 211 can expose the surface of the substrate 200. In some other embodiments, the first opening can also be formed within the substrate.

In some embodiments, after forming the first opening 211 and before forming the source-drain layer, the first sacrificial layer 202 exposed by the first opening 211 can be etched to form a second opening (not shown in the figure) between the two neighboring channel layers 212, and an inner sidewall 214 can be formed in the second opening.

Figure 24:
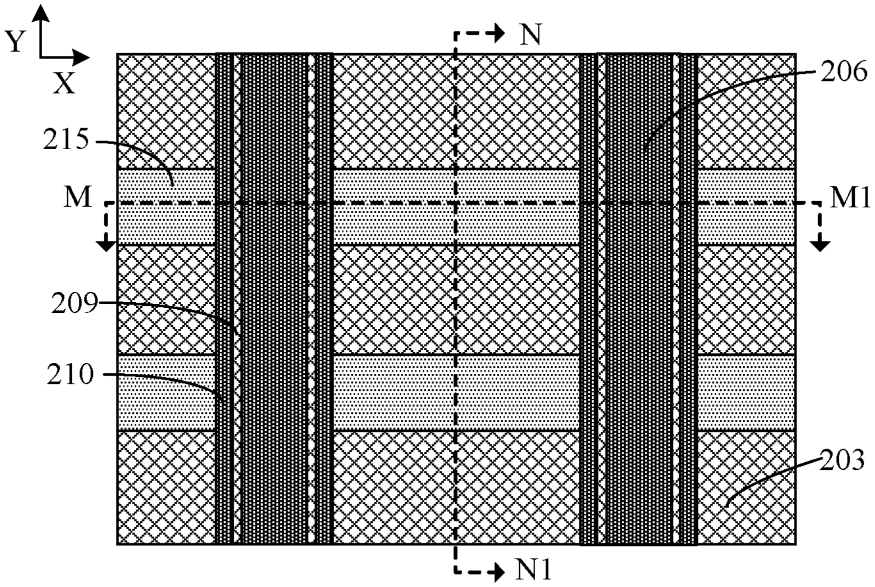
Figure 25:
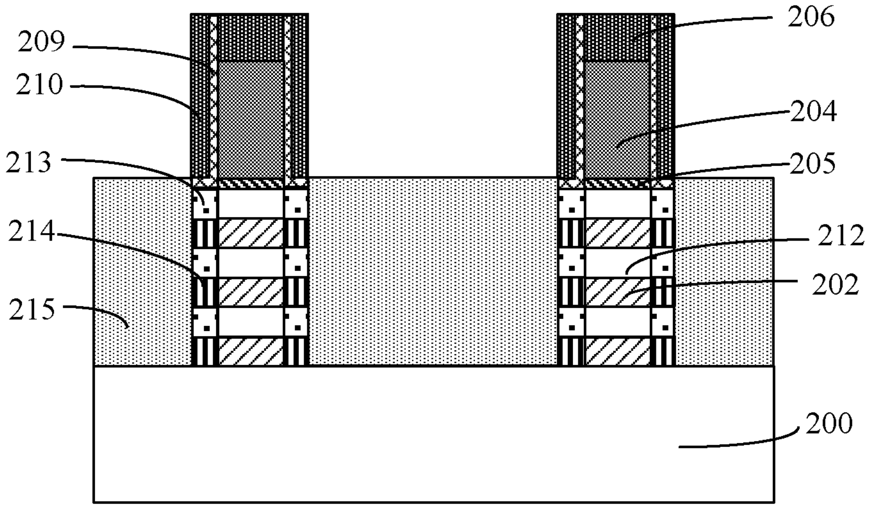
Figure 26:
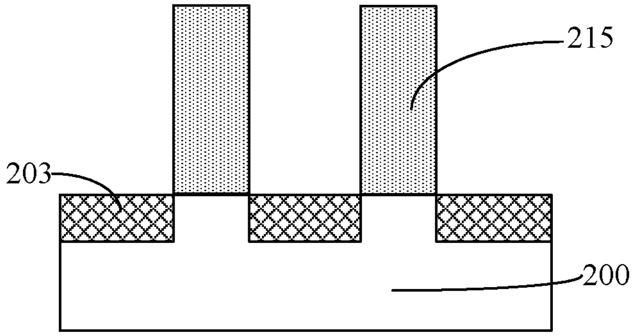

As shown in FIGS. 24 to 26, FIG. 24 is a top view of FIG. 25 and FIG. 26. FIG. 25 is a cross-sectional view along direction MM1 in FIG. 24. FIG. 26 is a cross-sectional view along direction NN1 in FIG. 24. An epitaxial layer (not shown in the figure) can be formed within the first opening 211, and the epitaxial layer can include dopants. The epitaxial layer can be used to form the source-drain layer 215.

Figure 27:
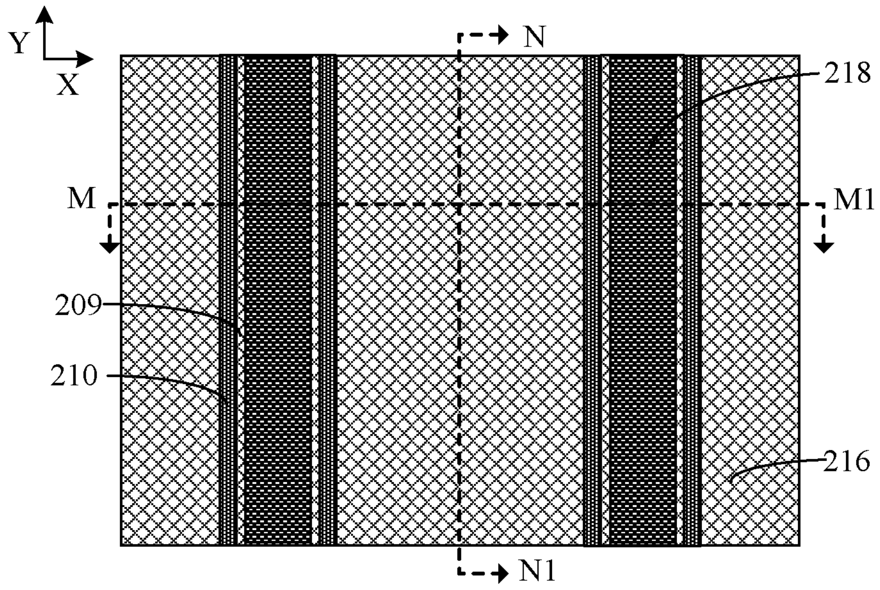
Figure 28:
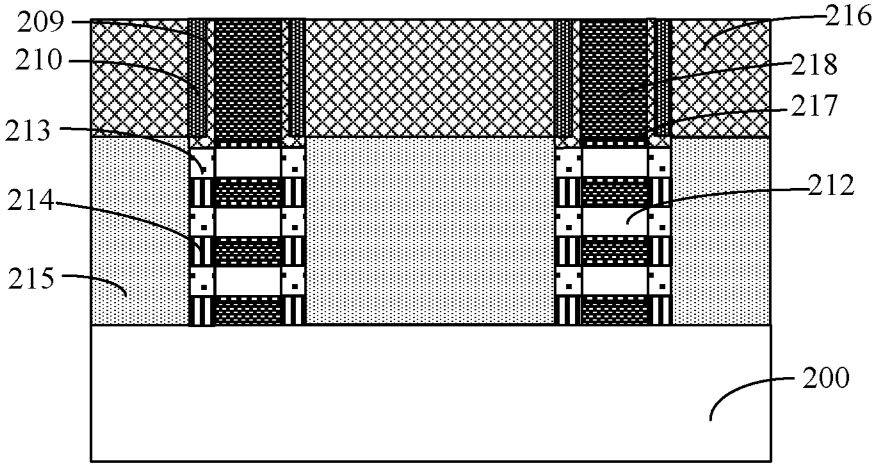
Figure 29:
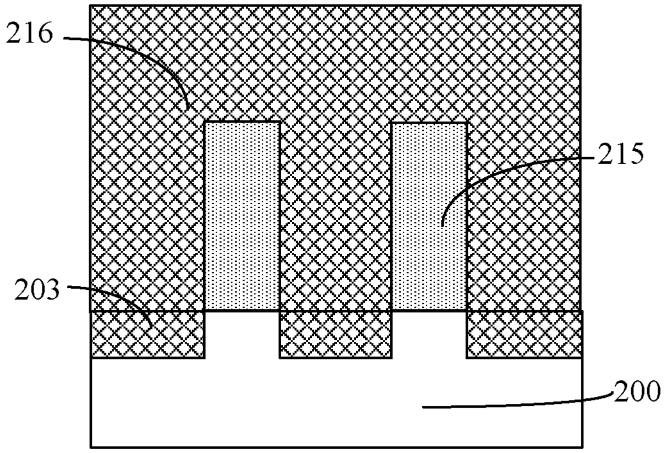
Figure 30:
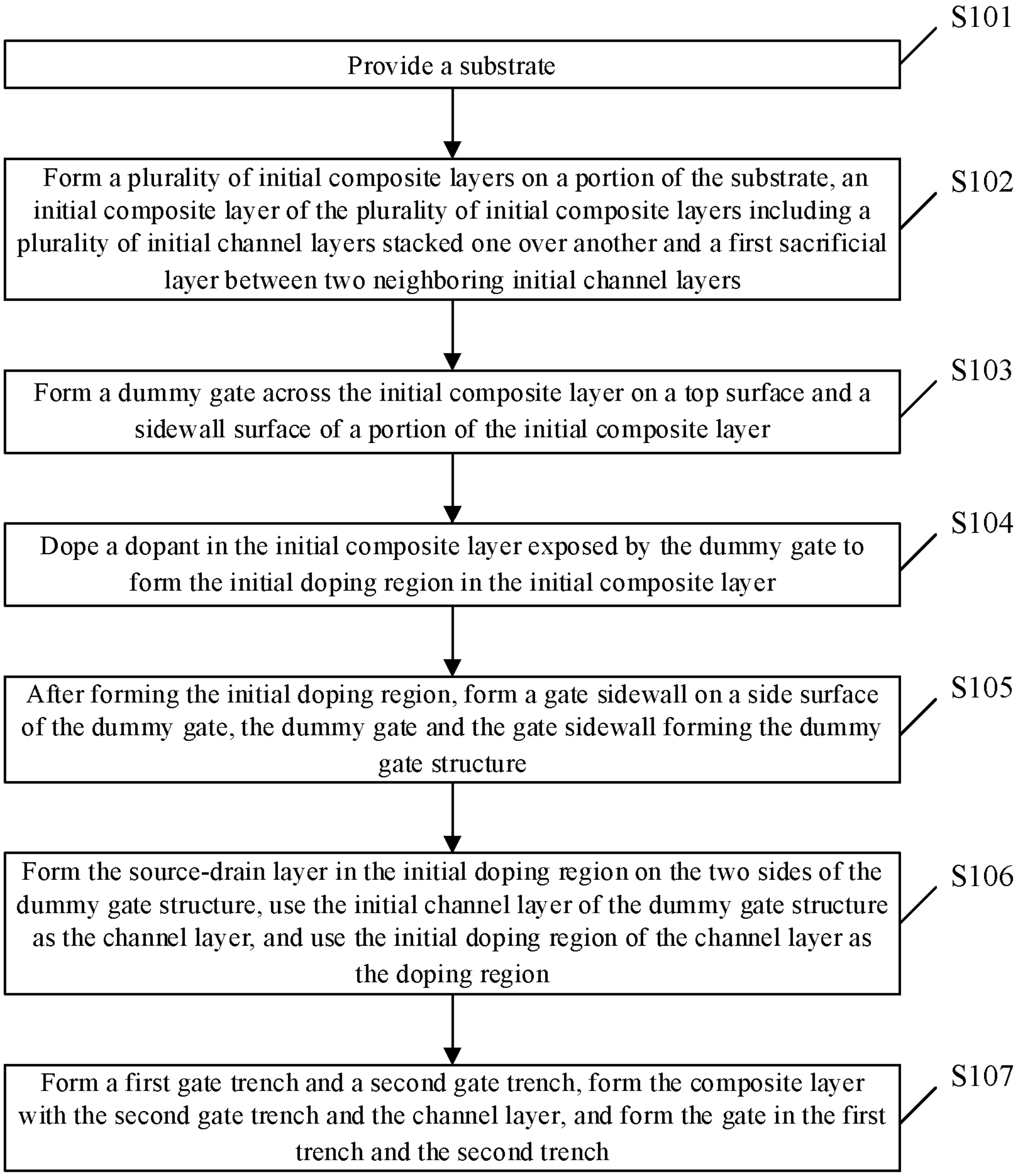
FIG. 30 illustrates an exemplary process for forming a semiconductor structure consistent with the disclosed embodiments of the present disclosure.

In some embodiments, after forming the source-drain layer 215, refer to FIGS. 27 to 29.

As shown in FIG. 30, a first gate trench and a second gate trench are formed, the composite layer is formed with the second gate trench and the channel layer, the gate is formed in the first trench and the second trench (S107). As shown in FIGS. 27 to 29, FIG. 27 is a top view of FIG. 28 and FIG. 29. FIG. 28 is a cross-sectional view along direction MM1 in FIG. 27. FIG. 29 is a cross-sectional view along direction NN1 of FIG. 27. An interlayer dielectric layer 216 is formed on the surface of the substrate 200 and the surface of the initial composite layer. The interlayer dielectric layer 216 exposes the top of the dummy gate 204. The dummy gate 204 is removed to form a first gate trench (not shown in the figure) in the interlayer dielectric layer 216. The sacrificial layer 202 exposed by the first gate trench is removed to form a second gate trench (not shown in the figure) between the two neighboring channel layers 212. The second gate trench and the channel layer 212 can be used to form the composite layer. The gate can be formed in the first gate trench and the second gate trench.

Thus, the doping region 213 can be used to increase the doping ion concentration in the neighboring area of the channel layer 212 and the source-drain layer 215 to reduce the resistance of the neighboring region, which is beneficial to improve the operating current of the formed GAA device. Therefore, the device performance can be improved.

In some embodiments, forming the first gate trench can further include removing the dummy gate dielectric layer 205.

In some embodiments, the bottom of the gate sidewall can be in contact with the channel layer 212. In the process of forming the first gate trench, the gate sidewall can form a barrier between the first gate trench and the source-drain layer, which can prevent the possibility of generating a leakage current path between the gate sidewall and the channel layer 212.

In some embodiments, the gate can include a gate dielectric layer 217 and a gate electrode layer 218 formed on the surface of the gate dielectric layer 217.

Correspondingly, embodiments of the present disclosure further provide a semiconductor structure formed by using the method above. As shown in FIGS. 27 to 29. The semiconductor structure includes the substrate 200 and the plurality of composite layers formed on a portion of the substrate 200. A composite layer of the plurality of composite layers includes a plurality of channel layers 212 stacked one over another. The second gate trench (not shown in the figure) is formed between two neighboring channel layers. The semiconductor structure further includes an interlayer dielectric layer 216 formed on the surfaces of the substrate 200 and the composite layers, the first gate trench (not shown in the figure) formed in the interlayer dielectric layer 216, and the gate sidewall formed on the sidewall of the first gate trench. The first gate trench and the gate sidewall can be across a portion of the sidewall and a portion of the top surface of the composite layer. The first gate trench and the second gate trench can communicate with each other. The semiconductor structure further includes the gates formed in the first gate trench and the second gate trench. The gate and the gate sidewall can be used to form the gate structure. The semiconductor structure further includes the doping region 213 formed in the channel layer 212 below the gate sidewall and the source-drain layer 215 formed in the composite layers on the two sides of the gate structure.

The doping region 213 can be used to increase the doping ion concentration in the neighboring region of the channel layer 212 and the source-drain layer 215. Thus, the resistance of the neighboring region can be reduced, which is beneficial to increase the operating current of the formed GAA device. Therefore, the device performance can be improved.

In Some embodiments, the concentration of the dopant in the doping region 213 can range from 1E8 atom/cm3 to 9E15 atom/cm3.

The dopant can include N-type or P-type ions.

In some embodiments, the gate sidewall can include the first sidewall 209 and the second sidewall 210 formed at the sidewall of the first sidewall 209.

In some embodiments, the semiconductor structure can further include the inner sidewall 214 formed the sidewall of the second gate trench and between the two channel layers 212.

In some embodiments, the gate can include the gate dielectric layer 217 and the gate layer 218 formed on the surface of the gate dielectric layer 217. The gate dielectric layer 217 can be formed on the surface of the channel layer 212 exposed by the first gate trench and the second gate trench.

In some embodiments, the bottom of the gate sidewall can be in contact with the surface of the channel layer 212.

Although the present disclosure is described above, the present disclosure is not limited to this. Those skilled in the art can make various changes and modifications without departing from the spirit and scope of the present disclosure. Those changes and modifications are within the scope of the present disclosure. The scope of the present disclosure should be subject to the claims.

What is claimed is:

1. A semiconductor structure comprising:
- a substrate;
- a plurality of composite layers on a portion of the substrate, wherein a composite layer of the plurality of composite layers includes a plurality of channel layers stacked one over another and a second gate trench between two neighboring channel layers;
- an interlayer dielectric layer formed on a surface of the substrate and surfaces of the plurality of composite layers;
- a first gate trench formed in the interlayer dielectric layer and a gate sidewall formed on a side surface of the first gate trench, wherein the first gate trench and the gate sidewall cross over a portion of a sidewall and a portion of a top surface of the composite layer, and the first gate trench communicates with the second gate trench;
- a gate in the first gate trench and the second gate trench, the gate and the gate sidewall forming a gate structure;
- a doping region formed in a channel layer under the gate sidewall, a width of the doping region being equal to a width of the gate sidewall along a direction parallel to the substrate; and
- a source-drain layer formed in the composite layer on two sides of the gate structure.

2. The semiconductor structure according to claim 1, further comprising an inner sidewall formed on a sidewall of the second gate trench and between two neighboring channel layers.

3. The semiconductor structure according to claim 1, wherein the gate includes:
- a gate dielectric layer and a gate electrode layer formed on a surface of the gate dielectric layer, the gate dielectric layer being formed on a surface of the channel layer exposed by the first gate trench and the second gate trench.

4. The semiconductor structure according to claim 1, wherein a bottom of the gate sidewall is in contact with a surface of the channel layer.

5. The semiconductor structure according to claim 1, wherein:
- a concentration of a dopant in the doping region ranges from 1E8 atoms/$cm^3$ to 9E15 atoms/$cm^3$; and
- the dopant includes N-type or P-type ions.

6. The semiconductor structure according to claim 1, wherein a side surface of the gate sidewall is coplanar with a side surface of the doping region along a vertical direction perpendicular to the substrate.

7. The semiconductor structure according to claim 6, wherein another side surface of the gate sidewall is coplanar with another side surface of the doping region along the vertical direction perpendicular to the substrate.

8. The semiconductor structure according to claim 1, wherein the gate sidewall is made of a dielectric material including one or more of silicon oxide, silicon nitride, silicon oxynitride, silicon carbide, silicon carbonitride, and/or silicon carbon oxynitride.

9. The semiconductor structure according to claim 1, wherein the gate sidewall includes a first sidewall and a second sidewall formed on a sidewall of the first sidewall.

10. The semiconductor structure according to claim 9, wherein the first sidewall including a portion along the direction parallel to the substrate and the second sidewall is formed on the portion of the first sidewall.

11. The semiconductor structure according to claim 1, wherein the doping region is formed by a solid-state source diffusion process or an ion doping process.

12. The semiconductor structure according to claim 1, wherein the source-drain layer is formed from an epitaxial layer.

13. A method for forming a semiconductor structure comprising:
- providing a substrate;
- forming a plurality of composite layers on a portion of the substrate, wherein a composite layer of the plurality of composite layers includes a plurality of channel layers stacked one over another and a second gate trench between two neighboring channel layers;
- forming an interlayer dielectric layer on a surface of the substrate and surfaces of the plurality of composite layers;
- forming a first gate trench in the interlayer dielectric layer and a gate sidewall on a side surface of the first gate trench, wherein the first gate trench and the gate sidewall cross over a portion of a sidewall and a portion of a top surface of the composite layer, and the first gate trench communicates with the second gate trench;

forming a gate in the first gate trench and the second gate trench, the gate and the gate sidewall forming a gate structure;

forming a doping region in a channel layer under the gate sidewall, a width of the doping region being equal to a width of the gate sidewall along a direction parallel to the substrate; and forming a source-drain layer in the composite layer on two sides of the gate structure.

14. The method according to claim 13, wherein:

a concentration of a dopant in the doping region ranges from 1E8 atoms/cm$^3$ to 9E15 atoms/cm$^3$; and the dopant includes N-type or P-type ions.

15. The method according to claim 13, further comprising:

forming an inner sidewall formed on a sidewall of the second gate trench and between two neighboring channel layers.

16. The method according to claim 13, wherein the gate includes:

a gate dielectric layer and a gate electrode layer formed on a surface of the gate dielectric layer, the gate dielectric layer being formed on a surface of the channel layer exposed by the first gate trench and the second gate trench.

17. The method according to claim 13, wherein a bottom of the gate sidewall is in contact with a surface of the channel layer.

18. The method according to claim 13, wherein a side surface of the gate sidewall is coplanar with a side surface of the doping region along a vertical direction perpendicular to the substrate.

19. The method according to claim 18, wherein another side surface of the gate sidewall is coplanar with another side surface of the doping region along the vertical direction perpendicular to the substrate.

20. A method for forming a semiconductor structure comprising:

providing a substrate;

forming a plurality of initial composite layers on a portion of the substrate, wherein an initial composite layer of the plurality of initial composite layers includes a plurality of initial channel layers stacked one over another and a first sacrificial layer between two neighboring initial channel layers;

forming a dummy gate across the initial composite layer, wherein the dummy gate is formed on a top and a sidewall surface of a portion of the initial composite layer;

doping a dopant in the initial composite layer exposed by the dummy gate to form an initial doping region in the initial composite layer;

after forming the initial doping region, forming a gate sidewall on a side surface of the dummy gate to form a dummy gate structure with the dummy gate and the gate sidewall; and forming a source-drain layer in the initial doping region on two sides of the dummy gate structure, the initial channel layer under the dummy gate structure being used as a channel layer, and the initial doping region in the channel layer being used as a doping region.

* * * * *